(12) United States Patent
Porter

(10) Patent No.: US 7,087,296 B2
(45) Date of Patent: Aug. 8, 2006

(54) ENERGY ABSORBENT LAMINATE

(75) Inventor: John Frederick Porter, St. Catharines (CA)

(73) Assignee: Saint-Gobain Technical Fabrics Canada, Ltd., Ontario (CA)

( * ) Notice: Subject to any disclaimer, the term of this patent is extended or adjusted under 35 U.S.C. 154(b) by 285 days.

(21) Appl. No.: 09/997,168

(22) Filed: Nov. 29, 2001

(65) Prior Publication Data

US 2003/0104738 A1    Jun. 5, 2003

(51) Int. Cl.
*B23B 7/08*        (2006.01)
(52) U.S. Cl. .................. 428/223; 428/911; 442/331; 442/333; 442/381; 442/409; 442/415; 442/103; 442/134; 442/135; 442/149; 442/151; 442/168; 442/169; 442/170; 442/172; 442/180
(58) Field of Classification Search .............. 428/223, 428/911; 442/331, 333, 381, 409, 415, 103, 442/134, 135, 149, 151, 168, 169–170, 172, 442/180
See application file for complete search history.

(56) References Cited

U.S. PATENT DOCUMENTS

| | | | | |
|---|---|---|---|---|
| 4,043,703 A | | 8/1977 | Carlson ...................... 416/230 |
| 4,229,473 A | | 10/1980 | Elber .......................... 428/113 |
| 4,368,234 A | * | 1/1983 | Palmer et al. .............. 442/186 |
| 4,390,574 A | | 6/1983 | Wood .......................... 428/281 |
| 4,451,528 A | * | 5/1984 | Krause ..................... 428/300.4 |
| 4,550,051 A | * | 10/1985 | Spielau et al. .............. 442/233 |
| 4,556,439 A | | 12/1985 | Bannink, Jr. ................. 156/92 |
| 4,604,319 A | | 8/1986 | Evans et al. ................. 428/290 |
| 4,836,715 A | | 6/1989 | Wood ......................... 405/150 |
| 4,963,408 A | | 10/1990 | Huegli ......................... 428/71 |
| 5,316,604 A | * | 5/1994 | Fell ............................. 156/82 |
| 5,344,280 A | | 9/1994 | Langenbrunner et al. ...... 415/9 |
| 5,766,724 A | | 6/1998 | Tailor et al. ................ 428/110 |
| 5,836,357 A | | 11/1998 | Kittson et al. ................ 138/98 |
| 5,846,368 A | | 12/1998 | Sakaguchi et al. .......... 156/245 |
| 5,993,114 A | | 11/1999 | Jones ...................... 405/150.1 |
| 6,018,914 A | | 2/2000 | Kamiyama et al. ............ 52/20 |
| 6,117,551 A | | 9/2000 | Nagata et al. .............. 428/408 |
| 6,170,531 B1 | | 1/2001 | Jung et al. .................... 138/98 |
| 6,228,312 B1 | | 5/2001 | Boyce ........................ 264/458 |
| 6,254,709 B1 | | 7/2001 | Kamiyama et al. ........... 156/94 |

FOREIGN PATENT DOCUMENTS

| EP | 0783960 A2 | * | 1/1997 |
|---|---|---|---|
| GB | 2 235 156 A | | 2/1991 |
| JP | 1263030 | | 10/1989 |

OTHER PUBLICATIONS

Reinhart et al., Engineered Materials Handbook, 1987, vol. 1: pp 27-37, "Introduction to Composites" and pp. 479-495, "Joints".

(Continued)

*Primary Examiner*—Norca L. Torres-Velazquez
(74) *Attorney, Agent, or Firm*—Duane Morris LLP

(57) ABSTRACT

This invention provides multi-layered composites, laminates and composite joints in which at least one resin-impregnated, fiber-containing layer is joined or laminated to a core layer having a lower flexural modulus or higher elongation at break, higher toughness, or a combination of all or some of these properties. The multi-layer composite produced by laminating or joining these materials together has improved shearout, impact and cutting resistance, since stresses caused by outside forces can be more widely distributed throughout the composite.

20 Claims, 2 Drawing Sheets

OTHER PUBLICATIONS

European Search Report for EP 02 25 8062.

Examination Report for EP 02 25 8062.

* cited by examiner

ENERGY ABSORBENT LAMINATE

FIELD OF THE INVENTION

This invention relates to composite joints generally, and more specifically, to composite joints including at least one multi-layered composite having at least two layers of different toughness for helping to retard bearing stress and shearout stress.

BACKGROUND OF THE INVENTION

Fiber-reinforced composites are relatively brittle compared to conventional ductile metal alloys, such as stainless steel and aluminum. Yielding of ductile metals usually reduces the stress concentration around bolt holes so that there is only a loss of area, with no stress concentration at ultimate load on the remaining section at the joints. With composites, however, there is no relief at all from the elastic stress concentration, and catastrophic failure usually results without much warning. Even for small defects in composite structures, the stress-concentration relief is far from complete, although the local disbanding between the fibers and resin matrix and local intraply and interply splitting close to the hole edge does locally alleviate the most severe stress concentrations. Since the stress resistant capability of bolted and riveted joints in composite materials is often unacceptably low, such laminates can never be loaded to levels suggested by the ultimate tensile strength of the laminated composite itself.

It is recognized that the strength of a composite structure with both loaded and unloaded holes depends only slightly on the fiber pattern. Indeed, throughout the range of fiber patterns surrounding laminated structures, the bearing strength and gross-section strengths are almost constant, which simplifies the design process.

The design and analysis of bolted or riveted joints in fibrous composites remains very much an art because of the need to rely on empirical correction factors in some form or another. Mechanically fastened joints differ from bonded composite joints because the presence of holes insures that the joint strength never exceeds the local laminate strength. Indeed, after years of research and development, it appears that only the most carefully designed bolted composite joints will be even half as strong as the basic laminate. Simpler bolted joint configurations will typically attain no more than about a third of the laminate strength. However, because thick composite laminates are often impossible or impractical to adhesively bond or repair, there is a continued need for bolted composite structures.

Since bolted composite structural joints are so brittle, it is very important to calculate accurately the load sharing between fasteners and to identify the most critically loaded one. Bolted joints of composite materials are known to experience many modes of failure, including tension failure, shearout failure, bolts pulling through laminate failure, cleavage tension failure, bearing failure, cutting, impact and bolt failure. See *COMPOSITES, Engineered Materials Handbook V*1.1, pp. 479–495 (1987), which is hereby incorporated by reference.

The use of local softening strips and pad-ups, has been known to alleviate some of the stress concentrations with respect to basic laminate structures. However, such an approach is not without drawbacks, since these modifications leave the structure outside the locally protected areas with little, if any, damage tolerance because the higher operating strain permitted by the softening strips and pad-ups severely limits the opportunity to perform repairs, which limits the number of situations in which such an approach is practical.

Accordingly, there remains a need for improving the failure resistance of composite structures. In addition, laminate composite technology needs to improve upon the existing design structures to minimize failures associated with shear, bearing, cutting and impact forces.

SUMMARY OF THE INVENTION

Multi-layered composites useful in high loading applications are provided by this invention. In a first preferred embodiment of a mechanically fastened composite joint of this invention, a substrate and a multi-layered composite are provided. The composite includes a pair of resin-impregnated, fiber-containing layers. The composite further includes a fiber-containing core layer having a lower tensile modulus, higher toughness, and/or higher elongation at break than the resin impregnated, fiber-containing layers. The core layer is sandwiched between the pair of resin-impregnated, fiber-containing layers. Upon subjecting this composite to high external forces, the resulting composite joint has improved shearout, cutting and impact resistance over that which would be expected if the composite layer were made in the same thickness without a core layer.

The multi-layered composites and laminates of this invention exhibit good tensile and flexural strength and moduli due to the strong tensile modulus layer, while surprisingly, also exhibit excellent bearing shearout, cutting and impact resistance due to the second layer or core layer having greater energy absorbing properties.

During shearout testing, a hole is drilled near the edge of the multi-layered composite, and a bolt is inserted. The force at failure caused by pulling the bolt in the direction of the plane of the composite is measured. This force is the shearout resistance of the composite to tiering or plowing. The multi-layered laminates of this invention have significantly higher shearout resistance than composites of similar thickness made from consolidated plies having the same resin and reinforcement dispersed throughout. While not being committed to any particular theory, it is believed that the lower integrity, tougher or more ductile second or core layer spreads the load, for example, to the sides of the hole and beyond the typical bearing and tangential (hoop) stress areas, such that several inches of the composite may become involved in stress relief. The preferred fibers in the core layer can absorb high amounts of energy, such as by elongating in a ductile fashion, delaminating from the skins, or bunching during delamination, to act in concert to resist damaging forces due to cutting, impact or shear.

In a further preferred embodiment of this invention, an energy absorbent laminate is provided. This laminate includes a pair of resin-impregnated, fiber-containing layers and a fiber-containing core layer having a higher toughness and greater elongation at break than said resin-impregnated, fiber-containing layers. The core layer is sandwiched between the pair of resin-impregnated, fiber-containing layers to form an integral composite. The integral composite has improved shearout, cutting and impact resistance over a composite of approximately the same thickness made without the core layer.

Further improvements offered by this invention are the use of core or second layers composed of lower modulus, higher elongation fibers, poorly wetted or weakly bonded high modulus fibers, in the form of yarn, roving, tow, woven fabric, non-woven fabric, or combinations thereof. The controlled, limited adhesion may be achieved by using the same, or different, resin matrix as in the first or outer layers, or by joining only some of the individual fibers in the core layer together by melting or curing. Alternatively, the core can contain no matrix resin at all, so that it readily absorbs external forces. If translucency is required, a low strength additive, such as polypropylene copolymer wax may be used to substantially eliminate air voids in the laminate structure.

In further developments of this invention, the composite or laminate structure can include essentially only two materials, such as polypropylene resin and glass, to increase recyclability. Recyclability is known to be improved by reducing the number of materials which can be separated from the composite.

Finally, this invention can include a multi-layered laminate including a fiber reinforced pair of outer skins and a core layer including an aramid fiber reinforcement having greater toughness. This high strength composite is particularly suitable for cockpit doors, explosion-resistance panels, such as air cargo containers, and bullet-proof vests.

BRIEF DESCRIPTION OF THE DRAWING

The accompanying drawings illustrate preferred embodiments of the invention, in which.

DETAILED DESCRIPTION OF THE PREFERRED EMBODIMENT

Figure 1:
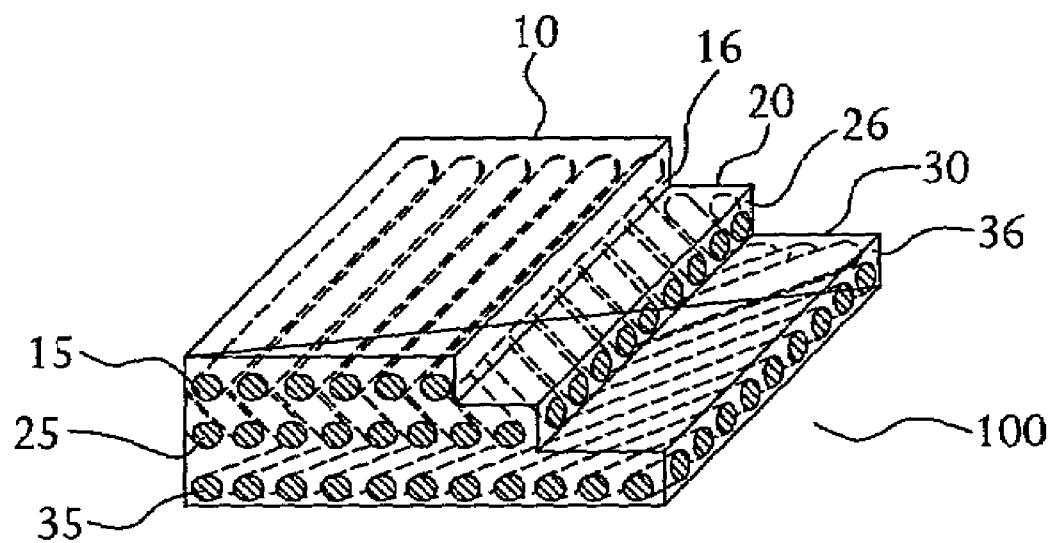
FIG. 1: is a side elevational, perspective view of a multi-layered composite of this invention illustrating fiber reinforcement in phantom.

Multi-layered composites and laminates are provided by this invention which have greater resistance to cutting, impact, bearing, hoop, and shearout forces when used alone or in connection with mechanical fasteners. The composite materials of this invention can be used for automobile and aircraft body panels, highway and road signs, truck panels, such as hoods and fenders, seats and panels for transit cars, boat hulls, bathroom shower-tub structures, chairs, architectural panels, agricultural seed and fertilizer hoppers, tanks and housings for a variety of consumer and industrial products. Further applications include printed-circuit boards, gears and sporting goods, such as skis, ski boards, and fishing poles. Aramid fiber embodiments of this invention can be useful in military structures and bullet-proof vests, as well as explosion-resistant panels for air cargo containers and cockpit doors. As used herein, the following terms are defined:

"Composite"—means any combination of two or more materials (such as reinforcing elements, fillers, etc., and a composite matrix binder) differing in form or composition on a macro scale. The constituents retain their identities: that is, they do not dissolve or merge completely into one another although they act in concert. Normally, the components can be physically identified and interface between one another.

"Laminate"—means a product made by uniting laminae or plies via bonding them together, usually with heat, pressure and/or adhesive. While normally referring to flat sheet, laminates can also include rods and tubes, and other non-planar structures.

"Fabric"—means a cloth which can be, for example, non-woven, needled, woven, knit or braided fibrous material, such as yarn, tow, roving or individual fibers.

"Mat"—means a fibrous material consisting of randomly oriented chopped filaments, short fibers, or swirled filaments loosely held together with a binder.

"Roving"—means a number of yarns, strands, tows, or ends, collected into a parallel bundle with little or no twist.

"Tensile Modulus" (also Young's modulus)—means the ratio of normal stress to corresponding strain for tensile or compressive stresses less than the proportional limit of the material.

"Tensile Strength"—means the maximum load or force per unit cross-sectional area, within the gauge length, of a specimen. The pulling stress required to break a given specimen. (See, for example, ASTM D579 and D3039, which are hereby incorporated by reference).

"Elongation"—means deformation caused by stretching. The fractional increase in length of a material stressed and tensioned (when expressed as a percentage of the original gauge length, it is called percentage elongation.)

"Elongation At Break"—means elongation recorded at the moment of rupture of the specimen, often expressed as a percentage of the original length.

"Basis Weight"—means the weight of a fibrous material, such as a fabric, mat, tape, etc., per unit area (width×length). Also sometimes called the "Areal Weight".

"Recyclability"—means the propensity of a material to be reused, reprocessed or remelted into the same or different product.

"Toughness"—means the amount of work required to cause failure, expressed as the area under the stress-strain curve of a test material. The absence of brittleness.

Figure 2:
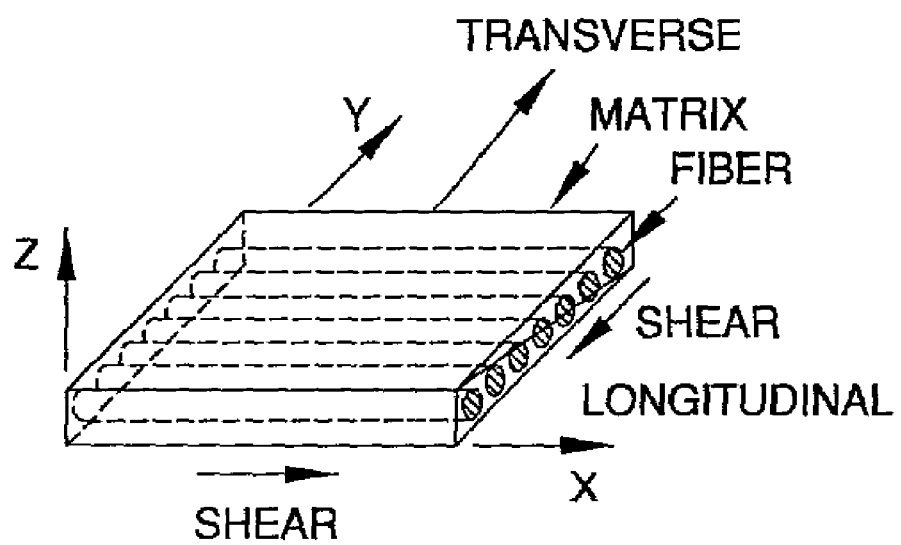
FIG. 2: is a side elevational perspective view of a single ply example for use with the multi-layered composite of this invention.

With reference to the Figures, and more particularly to FIGS. 1 and 2 thereof, there is shown a preferred multi-layered composite 100 having a pair of resin-impregnated, fiber-containing layers 10 and 30, and a fiber-containing core layer 20 having a lower flexural modulus, higher toughness, higher elongation at break or combination thereof. To provide a meaningful difference in properties, the core layer itself, and less desirably, just the individual fibers, should have approximately at least 10%, preferably at least 30%, and more preferably, at least 50% greater toughness and/or elongation at break, or at least 10%, preferably at least 30%, and more preferably, at least 50% lower tensile modulus. While these measured properties, as defined herein, represent distinctly different properties of a fiber or composite material, they all relate to core's 20 ability to absorb energy from externally applied forces.

The core layer 20 is preferably sandwiched between the pair of resin-impregnated, fiber-containing layers 10 and 30 to form an integral composite, or layered with a resin-impregnated, fiber-containing layer to form a two-layered structure. In the preferred multi-layered composite, the layers 10, 20 and 30 are plies of a laminated construction, which can contain glass, thermoplastic and/or thermosetting materials in the form of particles, fibers or matrices. Alternatively, the layers 10, 20 and 30 could be prepared with layers of B-stage thermosetting composites which are laid up and cured together. Additionally, the layers 10, 20 and 30 could be molded together, such as by suspending the core layer 20 in an injection mold, and molding layers 10 and 30 around the core layer 20. Each of the layers 10, 20 and 30, in this embodiment, preferably include some type of fiber, such as oriented fiber, tow, roving, and yarn, woven or non-woven fabric, web, or scrim. It is expected that some, or all of the fiber, or resin matrix may be eliminated from some of these layers, and/or subsequent layers, depending upon the end use for the laminate. For example, layers 10 and 30 could be consolidated composite layers and the core 20 could contain consolidated, resin coated, matrix encapsulated, loose, bonded, or oriented fibers.

As described in FIG. 2, the nomenclature of multi-layered composites includes the planar directions of X and Y, as well as the vertical direction, Z. It is known that most laminates are anisotropic, in that they provide different mechanical properties in the longitudinal and transverse directions. Although woven fabric may minimize the difference in properties in the transverse "X" and longitudinal "Y" directions, the layered interfaces between the layers 10, 20 and 30 create performance differences in the "Z" direction, such as intraply and interply splitting due to impact or cutting loads. There are also design concerns relating to the shear forces created by mechanical fasteners, such as bolts and rivets that are addressed below.

Figure 3:
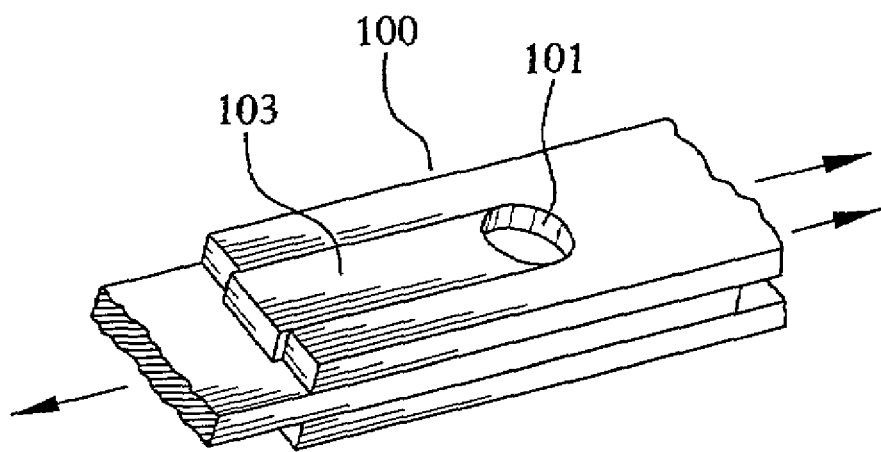
FIG. 3: is a diagrammatical perspective view of a bolted joint composite of this invention undergoing shear-out failure.

A shear test sample is described diagrammatically in FIG. 3. In such a sample, a multi-layered composite 100 receives a drilled hole 101 into which a mechanical fastener such as a bolt or rivet is inserted. The bolt or rivet is uniformly pulled in a single direction (along the arrow to the left) to test bearing and shearout strength. A typical shearout failure is illustrated by the dislodged portion 103 of the top resin-impregnated fiber-containing layer 10.

Figure 4:
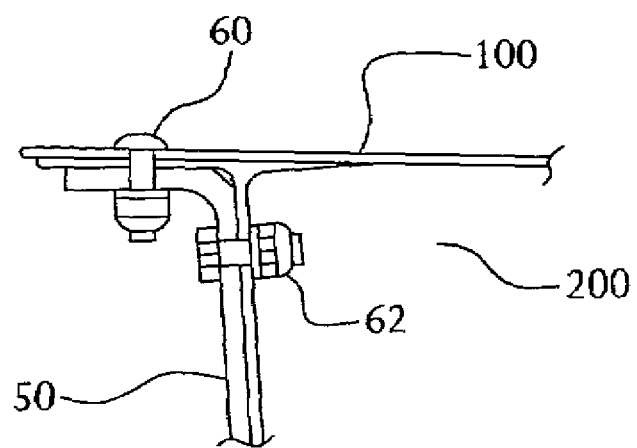
FIG. 4: is a substrate-supported multi-layered composite of this invention showing rivet and bolt fasteners.

As shown in FIG. 4, a composite joint 200 having greater resistance to cutting, shear and impact forces is provided, including a substrate material 50, multi-layered composite 100 and one or more fasteners, such as a rivet 60 or bolt 62. Such a joint design is typical of those associated with motor vehicle and aircraft body panels, and permits the replacement of damage panels in service. It is known that the composite 100 is often subjected to shearing forces, such as when a motor vehicle travels along a bumpy highway, or an aircraft exhibits pressurization and depressurization during take offs and landings. The stresses within the composite joint can be caused by an expansion and contraction of the substrate 50, which is typically steel or aluminum, in relation to the composite 100, which may, or may not, expand or contract to the same degree. Small differences of 1–10% in the thermal expansion coefficient between the composite 100 and the substrate 50 could have a dramatic impact on the bearing stress at the site of the rivet 60 or bolt 62. Such composites can also be subject to cutting forces during an accident or when cut by metal shears during a break-in, as well as impact forces, such as when impacted by a ballistic projectile or explosion gases or debris. Composite 100 has improved resistance to failure by such mechanisms created by using, for example, tougher, more ductile, or weakly bonded layers to absorb energy during shear. For example, the fibrous reinforcement 15 and 35 could be a fiberglass woven or non-woven fabric having a basis weight of at least about 400 $g/m^2$, preferably about 500–700 $g/m^2$, and the fibrous reinforcement 25 can be a nylon, rayon, polyester, acrylic, or a polyolefin, such as polyethylene, polypropylene, or high tenacity polypropylene, for example. Such polymeric materials of the core layer 20 can be provided in a yarn, mat, scrim, tows, roving, woven, non-woven or knitted fabric, having a basis weight of at least about 200 $g/m^2$, and preferably about 300–500 $g/m^2$. In such an example, the glass fiber clearly would have a higher tensile modulus than polyethylene or polypropylene fibers. If polypropylene is selected for the matrices 16 and 36, as well as fibrous reinforcement 25, the composite could also be economically recycled, since it would contain essentially only two readily heat separable materials (95 wt. % or better), e.g., glass and polypropylene.

A suitable composite material for the fiber or fibrous reinforcement 15, 25 and/or 35 is available from Vetrotex International of 767 quai des Allobroges—BP 929, 73009 Chambery Cedex, France (a subsidiary to St. Gobain) under the registered trade name Twintex®. Twintex® is, for instance, available as wound rovings, or woven fabrics, or tows comprising homogeneously intermingled long filaments of thermoplastics such as polypropylene, polyethylene, polyethyleneterephthlate (PET) and polybutylterephthlate (PBT) with E-glass, the glass fiber content typically being 45 to 75 wt. % (20 to 50 vol %). The Twintex® manufacturing process enables the thermoplastic and glass fiber filaments to be mixed "dry" with a high degree of control over the distribution of the two filamentary fibers. The dry fibers could then be filled with resin, partially or fully consolidated under heat and/or pressure, or left dry as a core layer 20, and bonded to layers 10 and 30, for example. Alternatively, a multi-layered composite could be manufactured entirely from Twintex® material, by fully consolidating two Twintex® layers for the resin-impregnated, fiber-containing layers 10 and 30, and partially consolidating or loosely heat bonding a Twintex® material for the core layer 20.

Alternatively, for use in bullet or explosion proof panels and vests, the fiber reinforcement 25 in core layer 20 could be an aramid fiber reinforcement, such as Kevlar® woven or knit fabric, with or without a resinous matrix, having a basis weight of at least about 1,000–5,000 $g/m^2$, while using a glass fabric of a basis weight of only about 200–600 $g/m^2$ for fiber reinforcements 15 and 35. The resulting structure would be stronger at its core than composite 100, since Kevlar® fibers typically have a higher tensile or Young's modulus than glass fibers, but would still absorb ballistic forces, since Kevlar® fibers typically have greater toughness and elongation at break than glass fibers.

The polymer resins compositions 16, 26 and 36 of composite 100 could be the same resin, so as to improve recyclability, or different resins, to enable, for example, better binding to themselves or to different reinforcement selections for fibrous reinforcements 15, 25 and 35. In one preferred embodiment of this invention, a single fiber composition is used for the fibrous reinforcements 15, 25 and 35, with a lower basis weight fabric selected for the core layer reinforcement 25 than the outer layer reinforcements 15 and 35. Additionally, most preferred embodiments of this invention also include the same resin employed for the resin compositions 16, 26 and 36, or the elimination of resin 26 entirely, so that the final composite 100 can be more easily recycled. Conventional recycling of composite materials typically enables two phase systems, such as glass fiber and a single thermoplastic resin to be readily separated, for example, by melting the resin above the resin's melting point, but below the melting point of glass.

In accordance with the preferred embodiments of this invention, the following material selection information is provided.

Fibers used in the multi-layer composite 100 embodiment of this invention can be selected from tough, lower modulus resinous or natural fibers and high-strength, textile-type fibers, the latter of which are typically coated with a binder and coupling agent to improve compatibility with the resin, and a lubricant, to minimize abrasion between filaments. The fiber-resign matrix compositions 16, 26, and 36 for layers 10, 20 and 30 can be supplied as ready-to-mold compounds such as sheet molding compounds ("SMC") or bulk molding compounds ("BMC"). These layers 10, 20 and 30 may contain as little as 5 wt. %, and as much as 80 wt. % fiber by weight. Pultruded shapes (usually using a polyester matrix) sometimes have higher fiber contents. Most molded layers, for best cost/performance ratios, contain about 20 to 60 wt. % fiber.

Practically all thermoplastic and thermoset resins useful herein as matrices and/or fibers are available in fiber-reinforced compounds, prepregs, lay-ups, and rolls. Those suitable for this invention include epoxy, phenolics, polyester, melamine, silicone and/or polyamide thermosetting compositions, and nylon, polypropylene, polyethylene, unsaturated polyester, polyvinylchoride, polystyrene, ABS, and/or SAN thermoplastics. The higher performance thermoplastic resins—PES, PEI, PPS, PEEK, PEK, and liquid-crystal polymers for example—are suitable in the reinforced layers of this invention.

Fiber reinforcement improves most mechanical properties of plastics by a factor of two or more. The tensile strength of nylon, for example, can be increased from about 10,000 psi to over 30,000 psi, and the deflection temperature to almost 500° F., from 170° F. A 40 wt. % glass-fortified acetyl has a flexural modulus of $1.8 \times 10^6$ psi (up from about $0.4 \times 10^6$), a tensile strength of 21,500 psi (up from 8,800), and a deflection temperature of 335° F. (up from 230° F.). Reinforced polyester has double the tensile and impact strength and four times the flexural modulus of the unreinforced resin. Also improved in reinforced compounds are tensile modulus, dimensional stability, hydrolytic stability, and fatigue endurance.

The multi-layered composite 100 can also be a laminate. Laminated plastics are a special form of polymer-matrix composite, which often contain layers of reinforcing materials that have been impregnated with thermosetting or thermoplastic resins, bonded together, and cured or formed under heat and pressure. The cured or formed laminates, called high-pressure laminates, can be provided in more than 70 standard grades, based on National Electrical Manufacturers Association (NEMA) specifications, which are hereby incorporated by reference.

Laminated plastics are available in sheet, tube, and rod shapes that are cut and/or machined for various end uses. The same base materials are also used in molded-laminated and molded-macerated parts. The molded-laminated method is used to produce shapes that would be uneconomical to machine from flat laminates, where production quantities are sufficient to warrant mold costs. The strength of a molded shape is higher than that of a machined shape because the reinforcing plies are not cut, as they are in a machined part. The molded-macerated method can be used for similar parts that require uniform strength properties in all directions.

Other common forms of laminated plastics useful for composite 100 are composite sheet laminates that incorporate a third material bonded to one or both surfaces of the laminate. Metals most often used in composites are copper, aluminum, nickel, and steel. Nonmetallics include elastomers, vulcanized fiber, and cork.

Vulcanized fiber is another product often classified with the laminated plastics because end uses are similar. Vulcanized fiber is made from regenerated cotton cellulose and paper, processed to form a dense material (usually in sheet form) that retains the fibrous structure. The material is tough and has good resistance to abrasion, flame, and impact.

Glass is the most widely used reinforcing material in composites generally, and is a preferred fiber for fibrous reinforcements 15, 35, and less so for fibers 25. Glass fiber has a tensile strength of about 500,000 psi (virgin fiber at 70° F.). All forms of glass fibers are produced in the standard C-glass, S-glass, A-glass, ECR-glass and E-glass reinforcement types. S-glass has a tensile strength about one-third higher than that of E-glass, but the cost of S-glass is considerably higher. S-2 Glass, a product of Owens-Corning, is a variant of S-glass, having the same batch composition but without the rigid, military quality-control specifications. Properties are similar to those of S-glass; and the cost is between that of E and S-glass. Other reinforcements which can be used are carbon, graphite, boron, and aramid (Kevlar®) for high-performance requirements; glass spheres and flakes, fillers such as powderized $TiO_2$, MgO and $Al_2O_3$; and fibers of cotton, jute, and synthetic materials such as olefins, for example, polyethylene, polypropylene, and polystyrene, as well as, nylon and polyester (such as Compet and Spectra fibers available from Allied-Signal Corp.), and ceramic materials.

Fibers are available in several forms: roving (continuous strand), tow, yarn, knits, chopped strand, woven fabrics, continuous-strand mat, chopped-strand mat, and milled fibers (hammer milled through screens with openings ranging from $1/32$ to $1/4$ in.). The longer fibers provide the greater strength; and continuous fibers are the strongest.

Fibers in the composite 100 can be long and continuous, or short and fragmented, and they can be directionally or randomly oriented. In general, short fibers cost the least, and fabrication costs are lower, but the properties of resulting composites are lower than those obtainable with longer or continuous fibers.

Other reinforcements useful in this invention include paper, cotton, asbestos, glass, and polymeric fabric, mat and scrim. Papers are the lowest-cost reinforcing materials used in making laminates. Types include kraft, alpha, cotton linter, and combinations of these. Papers provide excellent electrical properties, good dimensional stability, moderate strength, and uniform appearance. Cotton cloth also is used for applications requiring good mechanical strength. The lighter-weight fabrics are not as strong but have excellent machinability. Asbestos, in the form of paper, mat, or woven fabric provides excellent resistance to heat, flame, chemicals, and wear. Glass-fiber reinforcements, in woven fabric or mat, form the strongest laminates. These laminates also have low moisture absorption and excellent heat resistance and electrical properties Nylon fabrics provide excellent electrical and mechanical properties and chemical resistance, but laminates reinforced with these materials may lack dimensional stability at elevated temperatures. Other fabrics, which are especially useful for the fibrous reinforcement 25 of the core layer 20 include, polyolefins, such as polyethylene or polypropylene knit, woven, non-woven fabric or scrim, or Twintex® polyolefin and glass fiber mixtures. Additionally, aramid fabrics, woven or non-woven, could be used in ballistic applications.

Typical mechanical properties for high and low strength fibers are provided in Table 1 and Table 2 below:

TABLE 1

| Core candidate fibers having high toughness and low modulus | |
| --- | --- |
| polyester | .35–.55 g-cm-% |
| nylon 6/6 | .8–1.25 g-cm-% |
| polypropylene | .75–3 g-cm-% |
| polyethylene | .75–4 g-cm-% |

TABLE 2

Properties of certain high strength fiber materials

| Material | Density, g/cm³ | Longitudinal Young's modulus | | Tensile strength | |
|---|---|---|---|---|---|
| | | GPa | 10⁶ psi | MPa | ksi |
| Polyester | 1.36 | 13.8 | 2.0 | 1100 | 160 |
| E-glass | 2.52 | 72.3 | 10.5 | 3450 | 500 |
| S-glass | 2.49 | 85.4 | 12.4 | 4130 | 600 |
| Kevlar 49 | 1.44 | 124 | 18.0 | 2760 | 400 |
| T-300 | 1.72 | 218 | 31.6 | 2240 | 325 |
| VSB-32 | 1.99 | 379 | 55.0 | 1210 | 175 |
| FP | 3.96 | 379 | 55.0 | 1380 | 200 |
| Boron | 2.35 | 455 | 66.0 | 2070 | 300 |
| Silicon Carbide | 3.19 | 483 | 70.0 | 1520 | 220 |
| GY-70 | 1.97 | 531 | 77.0 | 1720 | 250 |

This invention will be further described in connection with the following examples:

EXAMPLE A

A tri-layered laminate was prepared using two plies of 600 g/m² consolidated polypropylene glass Twintex® fabric sheet as the outer layers and a 400 g/m² woven polypropylene fabric as the core layer. The core layer was bonded to the outer layers in a controlled way using a pair of polyethylene adhesive webs, such that a moderate amount of adhesion was achieved upon heating and pressing the combination of layers together. The resulting laminate exhibited higher shearout resistance, high impact and flexural strength and was capable of being recycled due to the presence of principally one thermoplastic matrix, and one fiber type, glass. This design was highly suitable for truck roof panels, highway signs and other fastened plate uses.

EXAMPLE B

Another tri-layered laminate was prepared by laminating together two 400 g/m² consolidated polypropylene-glass Twintex® sheets as the outer skins. These skins were combined with a core layer of 300 g/m² woven aramid fiber (Kevlar®) and consolidated at 200° C. (400° F.), below the melting point of Kevlar®. Alternatively, the Twintex® sheets can be consolidated independently and then glued or joined with polyethylene adhesive webs, or the layers laminated with heated press rolls. The Kevlar® fiber could contain a compatible coating, such as polypropylene, to improve adhesion. The resulting composite was combined with heat and pressure, and resulted in a highly explosion-resistant panel suitable for air cargo containers and cockpit doors.

In view of the foregoing, it can be realized that this invention provides improved multi-layered composite structures suitable for composite joints involving metallic substrates and mechanical fasteners. The preferred embodiments of this invention use a core or second layer having a lower flexural modulus, higher toughness and/or higher elongation at break than the skin layers or first layer for allowing better distribution of bearing forces due to mechanical fastener loading. Certain other embodiments of this invention employ a single matrix resin and/or a single fiber composition or, essentially, only (95% by weight or better) two materials, so that the final composite can be recycled readily using conventional means. Although various embodiments have been illustrated, this is for the purpose of describing, but not limiting the invention. Various modifications which will become apparent to those skilled in the art, are within the scope of this invention described in the attached claims.

I claim:

1. A bolted or riveted mechanically fastened composite structural joint, comprising:
    (a) a substrate material having a fastener hole;
    (b) a multi-layered composite having a fastener hole, and
    (c) a bolt or rivet fastener disposed within the fastener holes of the substrate and composite materials to secure the materials together;
    said multi-layered composite further including:
        (i) a pair of resin-impregnated, fiber-containing layers, having a first toughness;
        (ii) a fiber-containing core layer having a second, greater toughness than said pair of resin-impregnated fiber-containing layers, said fiber-containing core layer sandwiched between said pair of resin-impregnated, fiber-containing layers, wherein said pair of resin-impregnated, fiber-containing layers are laminated to said fiber-containing core layer; and
        (iii) a polyolefin adhesive web disposed between said fiber-containing core layer and each of said pair of resin-impregnated fiber-containing layers;
    said composite joint having improved resistance to damage caused by externally applied forces;
    wherein said fiber-containing core layer contains no matrix resin.

2. The composite joint of claim 1 wherein said fiber-containing core layer comprises polymeric fibers and said pair of resin-impregnated, fiber containing layers comprise glass fibers.

3. The composite joint of claim 1 wherein at least one of said pair of resin-impregnated, fiber-containing layers comprises a fiber having a first elongation at break, and said fiber-containing core layer comprises a fiber having a second elongation at break which is higher than said first elongation at break.

4. The composite joint of claim 1 wherein at least one of said pair of resin-impregnated fiber containing layers comprises a high tensile modulus fiber and said fiber-containing core layer comprises a roving, yarn, or tow.

5. The composite joint of claim 1 wherein said pair of resin-impregnated, fiber-containing layers and said fiber-containing core layer comprise two readily separable materials, amounting to at least 95 wt. % of said composite, for facilitating recyclability.

6. An aircraft or motor vehicle body panel or door comprising the composite joint of claim 1.

7. The composite joint of claim 1, wherein said pair of resin-impregnated, fiber containing layers have a first tensile modulus and said fiber-containing core layer has a second tensile modulus that is lower than said first tensile modulus.

8. The composite joint of claim 1, wherein said composite material is formed by suspending the fiber-containing core layer in an injection mold, and molding the pair of resin-impregnated, fiber-containing layers around the fiber-containing core layer.

9. The composite joint of claim 1 wherein said fiber-containing core layer comprises a thermoplastic yarn, roving, tow, woven or non-woven fabric, mat, scrim or web.

10. The composite joint of claim 9 wherein said fiber-containing core layer comprises aramid fiber.

11. A bolted or riveted mechanically fastened composite structural joint, comprising:

(a) a substrate material;
(b) a multi-layered composite including:
  (i) a pair of resin-impregnated, fiber-containing layers, having a first toughness;
  (ii) a fiber-containing core layer having a second, greater toughness than said pair of resin-impregnated fiber-containing layers, said fiber-containing core layer sandwiched between said pair of resin-impregnated, fiber-containing layers wherein the fiber material of said pair of resin-impregnated, fiber-containing layers comprises a knit, woven or non-woven glass fabric having a basis weight of at least about 400 g/m$^2$, and the fiber material of the fiber-containing core layer comprises a woven or non-woven polymer fabric having a basIs weight of at least 200 g/m$^2$; and
  (iii) a bolt or rivet fastener engaged with the substrate and composite materials to secure the materials together;
  wherein said fiber-containing core layer contains no matrix resin.

12. The composite joint of claim 11, wherein said pair of resin-impregnated, fiber containing layers have a first tensile modulus and said fiber-containing core layer has a second tensile modulus that is lower than said first tensile modulus.

13. The composite joint of claim 11, wherein said fiber-containing core layer comprises aramid fibers.

14. The composite joint of claim 11, wherein said composite material is formed by suspending the fiber-containing core layer in an injection mold, and molding the pair of resin-impregnated, fiber-containing layers around the fiber-containing core layer.

15. The composite joint of claim 11, wherein said fiber-containing core layer comprises loose fibers.

16. A bolted or riveted mechanically fastened composite structural joint, comprising:
(a) a substrate material having a fastener hole;
(b) a multi-layered composite material having a fastener hole, the composite material disposed over at least a portion of the substrate material so as to align the fastener holes of the substrate and composite materials; and
(c) a bolt or rivet fastener disposed within the fastener holes of the substrate and composite materials to secure the materials together;
  wherein said composite material further includes:
    (i) a pair of resin-impregnated, fiber-containing layers having a first toughness; and
    (ii) a fiber-containing core layer having a second, greater toughness than said pair of resin-impregnated fiber-containing layers, said fiber-containing core layer sandwiched between said pair of resin-impregnated, fiber-containing layers; and
  wherein said fiber-containing core layer contains no matrix resin, and said fiber-containing core layer acts to absorb shear energy generated when a force is applied to said composite material via the bolt or rivet fastener.

17. The composite joint of claim 16, wherein said pair of resin-impregnated, fiber containing layers have a first tensile modulus and said fiber-containing core layer has a second tensile modulus that is lower than said first tensile modulus.

18. The composite joint of claim 16, wherein said fiber-containing core layer comprises aramid fibers.

19. The composite joint of claim 16, wherein said composite material is formed by suspending the fiber-containing core layer in an injection mold, and molding the pair of resin-impregnated, fiber-containing layers around the fiber-containing core layer.

20. The composite joint of claim 16, wherein said fiber-containing core layer comprises loose fibers.

* * * * *